US008086207B2

(12) United States Patent
Muthali et al.

(10) Patent No.: US 8,086,207 B2
(45) Date of Patent: Dec. 27, 2011

(54) LINEAR TRANSCONDUCTOR FOR RF COMMUNICATIONS

(75) Inventors: Harish Muthali, Round Rock, TX (US); Kenneth Charles Barnett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 671 days.

(21) Appl. No.: 11/761,947

(22) Filed: Jun. 12, 2007

(65) Prior Publication Data

US 2008/0231362 A1    Sep. 25, 2008

Related U.S. Application Data

(60) Provisional application No. 60/895,659, filed on Mar. 19, 2007.

(51) Int. Cl.
*H04B 1/26* (2006.01)
*H04B 1/28* (2006.01)

(52) U.S. Cl. .......... 455/323; 455/333; 455/241
(58) Field of Classification Search .......... 455/323, 455/333, 311, 341, 293; 327/280, 287, 359; 330/252, 253, 261
See application file for complete search history.

(56) References Cited

U.S. PATENT DOCUMENTS

| 4,720,685 | A |   | 1/1988  | Garuts            |         |
|-----------|---|---|---------|-------------------|---------|
| 5,498,953 | A | * | 3/1996  | Ryat              | 323/315 |
| 5,587,687 | A | * | 12/1996 | Adams             | 330/253 |
| 6,597,303 | B2| * | 7/2003  | Cosand            | 341/165 |
| 6,828,832 | B2| * | 12/2004 | Gabillard         | 327/103 |
| 7,109,796 | B2| * | 9/2006  | Heigelmayer et al.| 330/254 |
| 7,339,433 | B2| * | 3/2008  | Bhatacharya et al.| 330/257 |
| 7,554,403 | B1| * | 6/2009  | Sakurai           | 330/260 |
| 2002/0055341 | A1 | | 5/2002 | Otaka et al.      |         |
| 2002/0089377 | A1 | | 7/2002 | Hwang             |         |
| 2003/0001674 | A1 | | 1/2003 | Nagaraj           |         |
| 2005/0017784 | A1 | | 1/2005 | Takenaka          |         |
| 2005/0213532 | A1 | | 9/2005 | Liu et al.        |         |
| 2006/0135109 | A1 | | 6/2006 | Klumperink et al. |         |

FOREIGN PATENT DOCUMENTS

| JP | 57148914  U | 9/1982 |
| JP | 2001230637 A | 8/2001 |
| JP | 2002111417 A | 4/2002 |
| JP | 2002185272 A | 6/2002 |
| JP | 2004274564 A | 9/2004 |
| JP | 2006186696 A | 7/2006 |

OTHER PUBLICATIONS

International Search Report and Written Opinion—PCT/US2008/057319—International Searching Authority, European Patent Office, Jun. 16, 2008.
Pan T-W et al: "A 50-DB Variable Gain Amplifier Using Parasitic Bipolar Transistors in CMOS" IEEE Journal of Solid-State Circuits, IEEE Service Center, Piscataway, NJ, US, vol. 24, No. 4, Aug. 1, 1989, pp. 951-961, XP000066223 ISSN: 0018-9200.

* cited by examiner

*Primary Examiner* — Sonny Trinh
(74) *Attorney, Agent, or Firm* — Larry J. Moskowitz

(57) ABSTRACT

The present patent application comprises a linear transconductor having at least one input and at least one output, comprising a differential amplifier having a plurality of transistors and a plurality of inputs, wherein a difference of input signals is amplified, a cascode circuit having a plurality of transistors, wherein the transistors are operably connected to the differential amplifier, wherein reverse isolation between an input and an output of the linear transconductor is improved by decoupling the input and the output of the linear transconductor by mounting at least one transistor of the plurality of transistors of the cascode circuit as a common-gate stacked on the at least one transistor of the differential amplifier, an active load having a plurality of transistors operably connected between the cascode circuit and supply voltage, and an auxiliary device operably connected to the connection between the active load, the cascode device and ground.

28 Claims, 11 Drawing Sheets

US 8,086,207 B2

LINEAR TRANSCONDUCTOR FOR RF COMMUNICATIONS

This application claims benefit of U.S. Provisional Application No. 60/895,659 Titled "Linear Transconductor for a RF Mixer" filed Mar. 19, 2007, the entire disclosure of this application being considered part of the disclosure of this application.

BACKGROUND

1. Field of the Invention

The present application pertains to applications where a linear transconductor is required (i.e., a linear voltage to current conversion), and more specifically, a radio frequency (RF) mixer with improved intermodulation product suppression.

2. Background

Mixers are used for up-conversion of baseband (or low frequency) signals and for down-conversion of RF signals. Intermodulation suppression is useful for a RF receiver wherein the mixer serves to downconvert the RF signal to baseband. The mixer stage performs a voltage to current conversion. This conversion is nonlinear and, as a result, may produce intermodulation distortion.

Intermodulation distortion is caused by two spurious signals which have a small frequency offset between them, mixing together (due to the nonlinearity of the device characteristics). If tone 1 is referred to as f1 and tone 2 is referred to as f2, the intermodulation product 2f2−f1 or 2f1−f2 may lie close to the RF wanted signal and degrade the performance of the receiver. This tone is called the third order intermodulation product.

A receiver or a component of a receiver may be characterized by a third order distortion figure of merit referred to as "third order input intercept point" (IIP3). A third order input intercept point may be defined as the point at which the power in the third-order intermodulation (or distortion) product and the fundamental frequency (or tone) intersect. (See FIG. 1A). The power in the intermodulation product is proportional to the cubic power of the input signal amplitude. For an ideal amplifier (with no distortion) the IIP3 point may be at infinity. The higher the IIP3 point, the better the linearity or the distortion performance for the receiver.

Linearity and noise factor (NF) of a mixer may be dominated by the transconductor stage which translates a voltage input to a current. The mixer transconductor may be linearized with source degeneration (adding a resistor at the source of the transconductor devices), but this will occur at the expense of increased noise and reduction of gain of the mixer (degradation of noise factor).

The present invention is directed to overcoming limitations of the prior art and providing a transconductor with improved intermodulation suppression. Linearization is achieved with a feed-forward technique which minimizes compromise on the gain and noise figure.

SUMMARY OF THE INVENTION

In view of the above, the described features of the present invention generally relate to one or more improved systems, methods and/or apparatuses for an improved linear transconductor.

In one embodiment, the present patent application comprises a linear transconductor having at least one input and at least one output, comprising a differential amplifier having a plurality of transistors and a plurality of inputs, wherein a difference of input signals is amplified, a cascode circuit having a plurality of transistors, wherein the transistors are operably connected to the differential amplifier, wherein reverse isolation between an input and an output of the linear transconductor is improved by decoupling the input and the output of the linear transconductor by mounting at least one transistor of the plurality of transistors of the cascode circuit as a common-gate stacked on the at least one transistor of the differential amplifier, an active load having a plurality of transistors operably connected between the cascode circuit and supply voltage, and an auxiliary device operably connected to the connection between the active load and the cascode device and ground.

In another embodiment, the present patent application comprises a method of reducing intermodulation products in a linear transconductor, comprising receiving input signals, amplifying a difference of input signals, converting an input voltage into a current, sensing a nonlinearity in a main current, feed forwarding said nonlinearity, generating an auxiliary current in response to the nonlinearity, cancelling a nonlinear component in the main current by summing said auxiliary current with said main current, whereby intermodulation products are reduced, providing reverse isolation between an input and an output of said linear transconductor, and biasing an active load.

Further scope of the applicability of the present method and apparatus will become apparent from the following detailed description, claims, and drawings. However, it should be understood that the detailed description and specific examples, while indicating preferred embodiments of the invention, are given by way of illustration only, since various changes and modifications within the spirit and scope of the invention will become apparent to those skilled in the art.

BRIEF DESCRIPTION OF THE DRAWINGS

The features, objects, and advantages of the presently disclosed method and apparatus will become more apparent from the detailed description set forth below when taken in conjunction with the drawings in which like reference characters identify correspondingly throughout and wherein.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well known structures and devices are shown in block diagram form in order to avoid obscuring the concepts of the present invention.

The problem is solved with the use of a transconductor with feed-forward linearization, where in a differential pair of n-type metal-oxide-semiconductor (NMOS) transistors connected as a common source device converts the input voltage into a current. (Assuming a small-signal assumption is adhered to, the signal current id is proportional to $v_{gs}$ with the proportionality constant called transconductance and denoted by $g_m$, where $i_d = g_m * v_{gs}$). Transconductors have varying degrees of linearity. In one design, the transconductor may also be referred to as a linear transconductor.

Figure 1A:
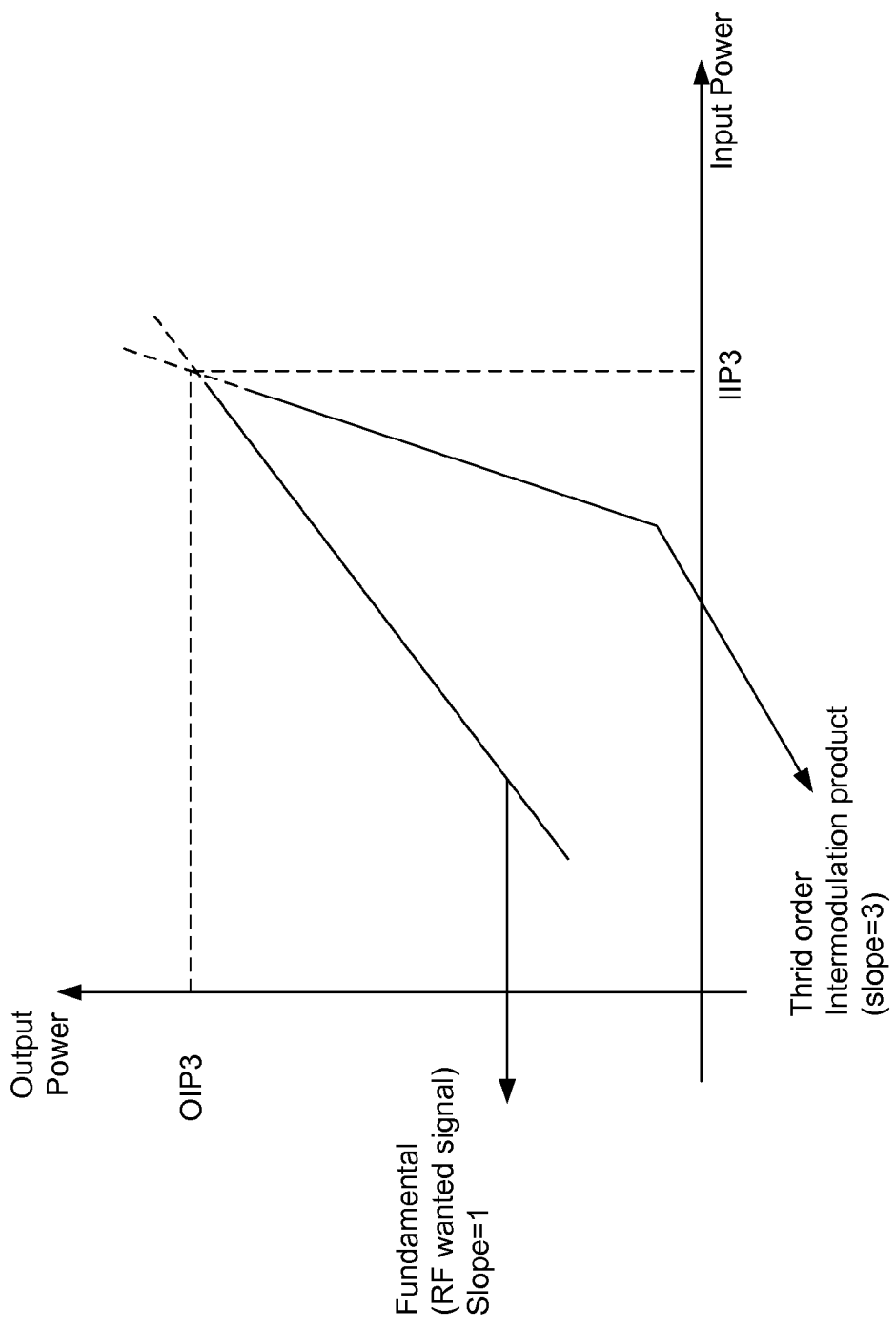
FIG. 1A is a graph illustrating receiver distortion vs. input power intercept point extrapolation (theoretical)
Figure 1B:
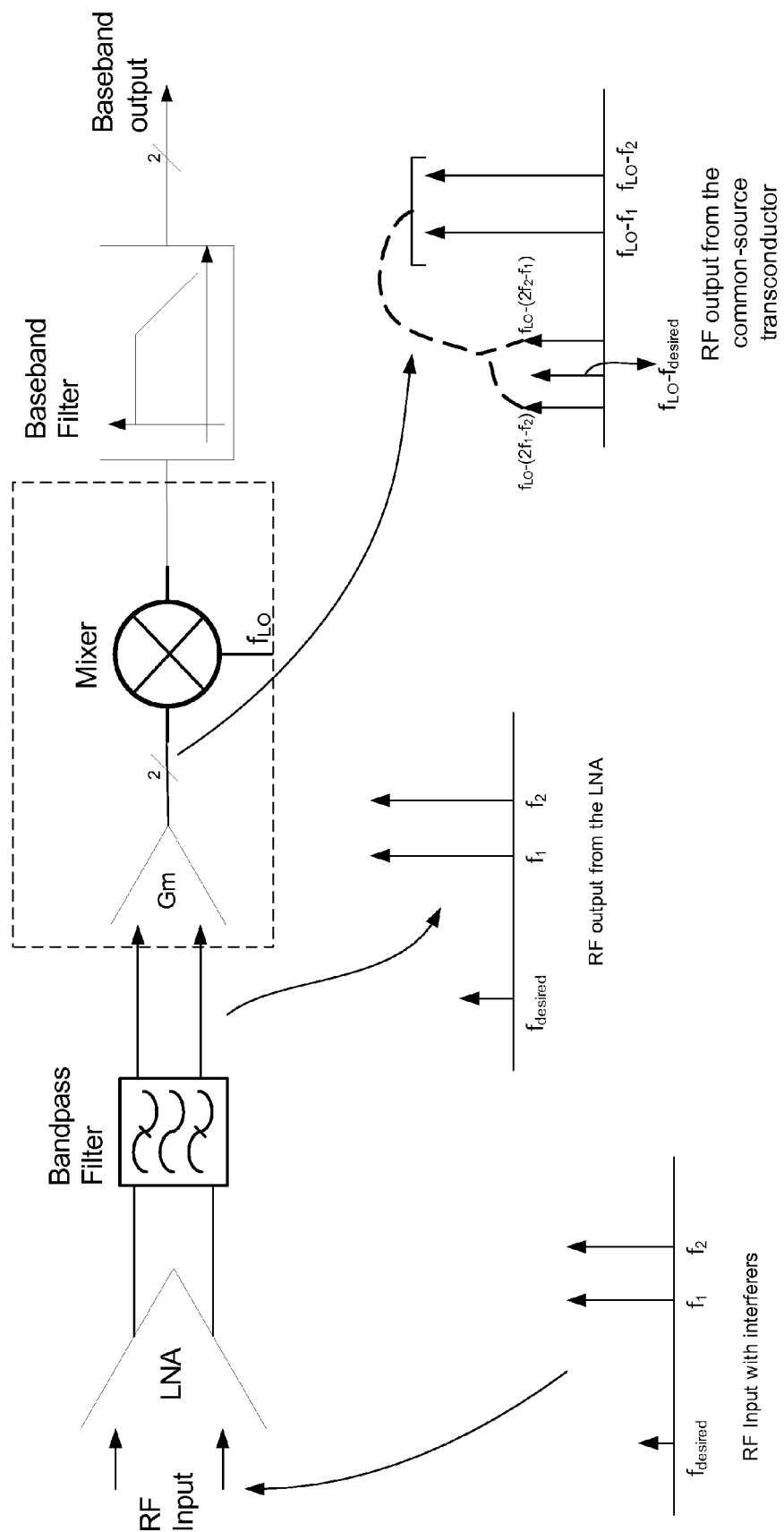
FIG. 1B illustrates how RF output with interferers from a low noise amplifier (LNA) that is input to a common source transconductor may degrade a signal-to-noise ratio of a receiver.

FIG. 1B illustrates how a common source transconductor may degrade a signal-to-noise ratio (C/N) of a receiver. What is needed is a linear transconductor which will minimize the intermodulation product well below a desired signal.

Figure 2:
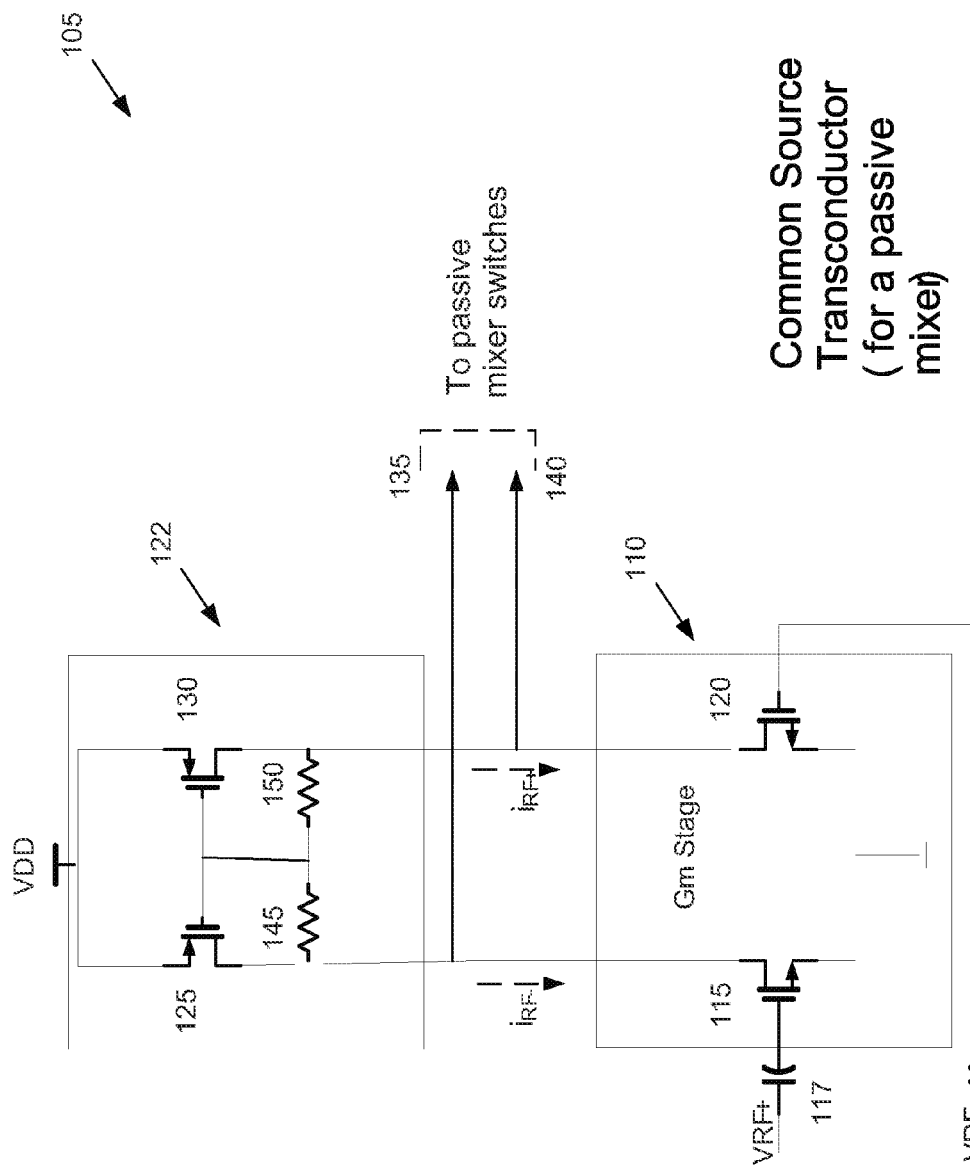
FIG. 2 is a diagram of a common source transconductor.

FIG. 2 contains a common source transconductor 105 which may be used with a passive mixer. It is further comprised of two subcircuits. At the bottom of FIG. 2 is a differential amplifier 110. The differential pair amplifier 110 has two inputs, a positive and a negative terminal which receive signals VRF+ and VRF− respectfully. The input transistors are 115 and 120 which receive respectfully input signals VRF+ and VRF−. For small values of $V_{RF+}$, $i_{RF+} = g_{mm1} * V_{RF+}$. The differential pair amplifier may be used as a linear amplifier for small signals. A differential pair responds to a difference mode or differential signals. In fact, with relatively small difference voltages, the entire bias current may be steered from one side of the pair to another.

The circuit 110 is called differential because it amplifies the difference of the input signals. Also, circuit 110 is known as a common source differential amplifier because the two input NMOS amplifiers 115 and 120 have their sources connected together (to ground in FIG. 2) and the inputs are their gates. One advantage of using a differential architecture is that ideally common mode signals will be rejected. Since the common mode signals appear at both gates, their difference is zero, and they will be rejected. Last, two capacitors, 117 and 119, appear at the inputs of transistors 115 and 120 respectfully.

At the top of FIG. 2 is a circuit 122 containing two p-type metal-oxide-semiconductor (PMOS) transistors, 125 and 130. Transistors 125 and 130 are "diode connected" transistors and may also be described as active loads. Transistors 125 and 130 serve to bias the NMOS devices 115, 120 in the saturation region. The sources of transistors 125 and 130 are connected to the supply voltage VDD. The drain of transistor 125 is connected to the drain of transistor 130. Likewise, the drain of transistor 130 is connected to the drain of transistor 120. In addition, the drain of transistor 125 is connected to a first output 135 which is operably connected to passive mixer switches. Likewise, the drain of transistor 130 is connected to a second output 140 which is operably connected to passive mixer switches.

Two resistors 145 and 150 are connected in series between the drains of PMOS transistors 125 and 130. These resistors are equal in value and serve to self-bias the PMOS transistors 125, 130. The non-linear behavior of the common source stage 110 will result in intermodulation distortion. The blocker signals or spurious signals at the input mix and produce undesired intermodulation products which will corrupt the desired signal output from the common source transconductor 110 to the mixer switches. This will degrade such metrics as the signal-to-noise ratio (C/N) of the receiver. What is needed is a linear transconductor which will minimize the intermodulation product.

Figure 3A:
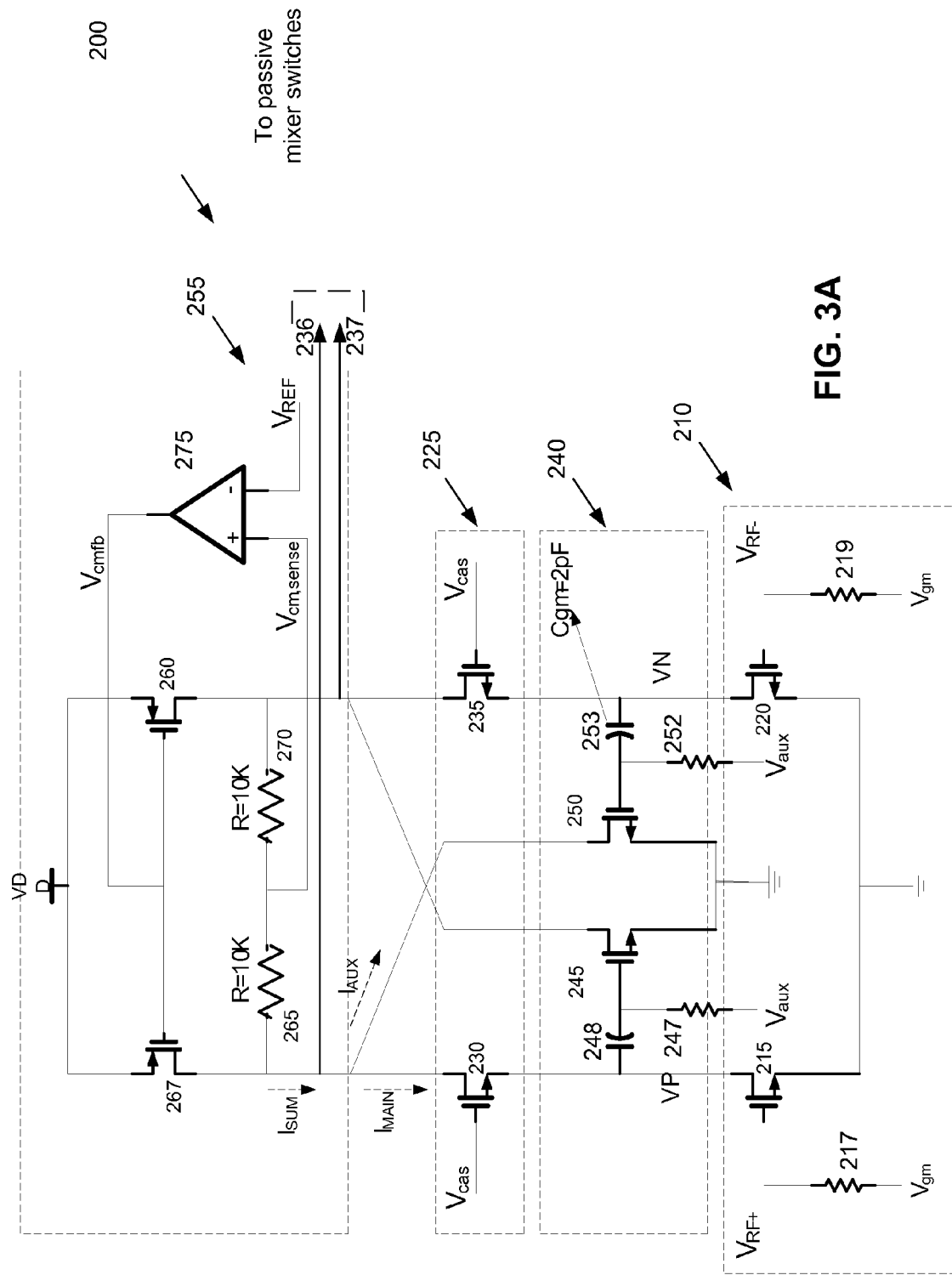
FIG. 3A is a diagram of a common source transconductor.

In FIG. 3A is an example of a linear transconductor 200 of the present patent application which provides a solution to the problem stated above. At the bottom of FIG. 3A is a differential amplifier 210. The differential pair amplifier 210 has two inputs, a positive and a negative terminal which receive signals VRF+ and VRF− respectfully. The input NMOS transistors are 215 and 220 which receive respectfully input signals VRF+ and VRF−, amplifies a difference of said input signals and converts the input voltage into a current. The two input NMOS amplifiers 215 and 220 have their sources connected together (to ground in FIG. 3A) and the inputs are their gates. The two input NMOS amplifiers 215 and 220 are biased in the strong inversion region for good linearity performance.

Last, two resistors, 217 and 219, are connected between the inputs of transistors 215 and 220 and $V_{gm}$ respectfully. The DC bias to these two transistors are provided through the resistors. The resistors isolate the main RF signal path from the bias circuit.

The transistors 230 and 235 are connected in a common gate configuration and serve as "cascode" devices and provide a low impedance for the transistors 215 and 220.

The nonlinearity in the $I_{MAIN}$ current is sensed by a cascode NMOS transistor circuit 225. More specifically, cascode NMOS transistors 230 and 235 sense the non-linearity in $I_{MAIN}$ due to main transistors 215 and 220. This nonlinearity is input to the feed forward (or auxiliary) transistors 245 and 250. These auxiliary transistors generate a current $I_{AUX}$ in response to the nonlinear input. The effective current $I_{SUM}$ is the summation of $I_{AUX}$ and $I_{MAIN}$. The current $I_{AUX}$ cancels the nonlinear component in $I_{MAIN}$ and thereby improves the intermodulation performance of the overall circuit. The auxiliary transistor pair [auxiliary devices] 245 and 250 are biased in the weak inversion region to provide the optimum cancellation of the non-linearity in $I_{MAIN}$.

Figure 3B:
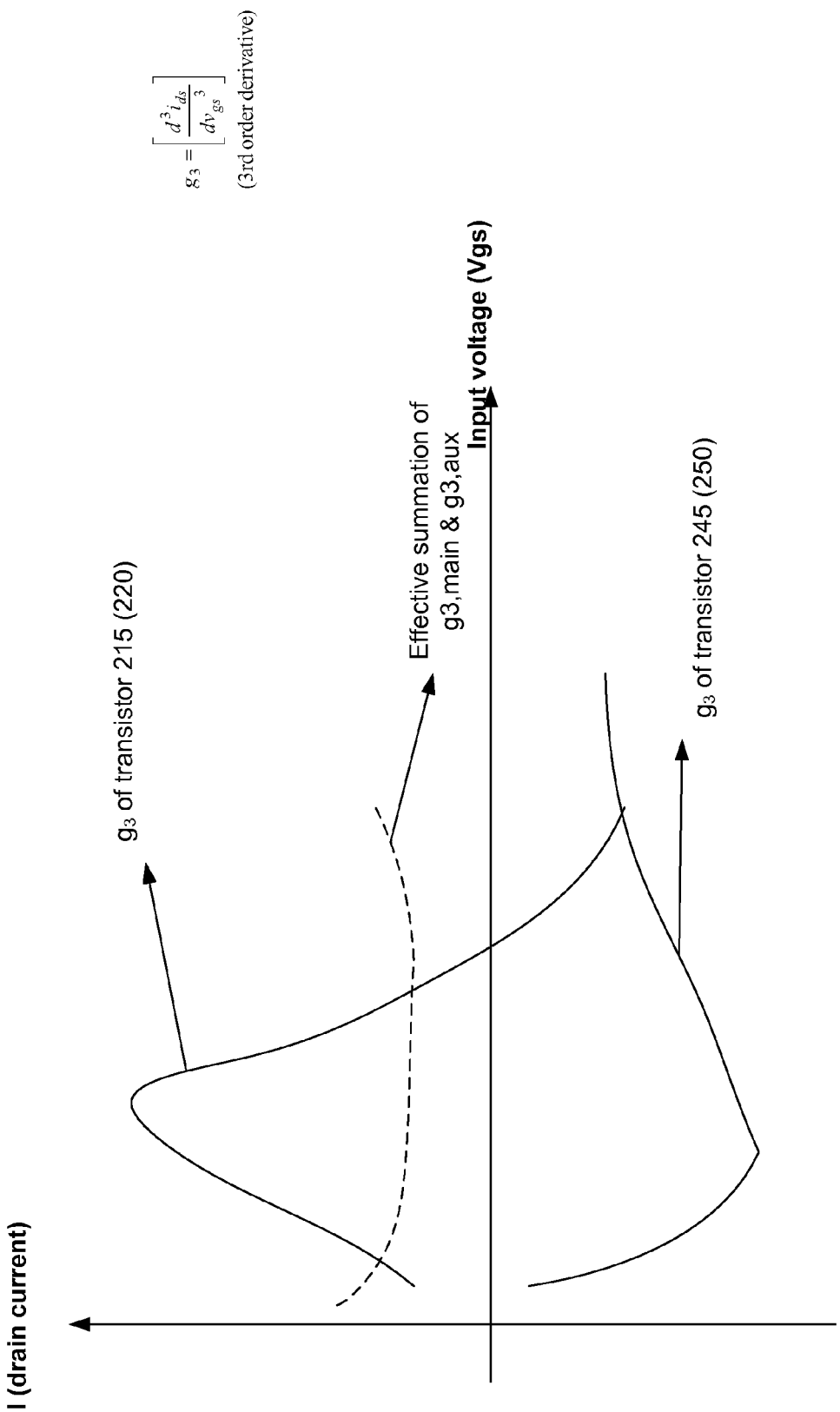
FIG. 3B shows the third order derivatives of the main transistors and the auxiliary transistors and effective summation of these two derivatives.

The voltage at the source of transistor 230 ($V_{cas} - V_{gs}$) responds to the nonlinear current from transistor 215. This change in the voltage due to the nonlinear current is sensed by the auxiliary transistor 245, and feed forwards an error current to be summed at the output node. The main differential pair devices 215 and 220 and the auxiliary devices 245 and 250 are biased in the appropriate region for optimum intermodulation performance. FIG. 3B shows the third order derivatives of the main transistors 215, 220 and the auxiliary transistors 245, 250 and effective summation of these two derivatives.

Furthermore, two resistors, 247 and 252, are connected between the inputs of transistors 245 and 250 and $V_{AUX}$ respectfully. These resistors provide isolation between the bias circuit and the main signal path. Last, two capacitors, 248 and 253, appear at the inputs of transistors 245 and 250 respectfully. These two capacitors allow the auxiliary device 240 (comprising transistors 245, 250) bias to be independent of the bias on the drain of the transistor(s) 215, 220. Capacitor 248 is connected between the gate of NMOS transistor 245 and the source of NMOS transistor 230. The source of NMOS transistor 230 is connected to the drain of NMOS transistor 215. Likewise, capacitor 253 is connected between the gate of NMOS transistor 250 and the source of NMOS transistor 235. The source of NMOS transistor 235 is connected to the drain of NMOS transistor 220.

The nonlinearity in $I_{MAIN}$ is subtracted by the feed-forward current $I_{AUX}$. The output current from the main transistors 215 and 220, $I_{MAIN}$, is summed with the feed-forward current $I_{AUX}$ from the auxiliary devices 245 and 250. The summing of the currents results in cancellation of the IM3 components from the two paths.

The cascode configuration circuit 225 (comprising NMOS transistors 230 and 235) is used to improve reverse isolation between an input and the output of the linear transconductor 200. One way to decouple input and output is by mounting a second transistor 230 as common-gate (CG) stacked on the common-source input transistor 215 (FIG. 3A). The upper metal-oxide-semiconductor (MOS) 230 acts as a current buffer between the output node (or drain of transistor 267) and the drain of the input transistor 215, thus separating them. Likewise, transistor 235 is stacked on the common-source input transistor 220.

At the top of FIG. 3A is an active load circuit 255 containing two PMOS transistors, 267 and 260. These transistors 267 and 260 serve as active loads and bias the drains of the cascode transistors 230 and 235. The impedance looking into the drains of these PMOS transistors 267 and 260 is high. As a result, intermodulation performance of the circuit 200 is improved. The transconductor 200 drives a passive mixer which is low impedance. The high impedance for the PMOS active load 267 and 260 helps minimize intermodulation distortion.

In addition, the drain of transistor 267 is connected to a first output 236 which is operably connected to passive mixer switches. Likewise, the drain of transistor 260 is connected to a second output 237 which is operably connected to passive mixer switches.

The operational amplifier 275 along with resistors 265 and 270 form a common mode feedback loop to bias the PMOS devices 267, 260. This improves the output impedance of the PMOS devices 267, 260. The other advantage of the common mode feedback loop is that over temperature and process variations, the drain voltage of the PMOS devices (and the auxiliary transistors) is fixed. This stabilizes the cancellation of the nonlinear components in $I_{MAIN}$ and $I_{AUX}$.

The nonlinear drain current may be described by the equation:

$$i_d = a_0 v_{in} + a_1 v_{in}^2 + a_2 v_{in}^3 + \ldots, \qquad \text{eq. 1}$$

where $a_0$, $a_1$, and $a_2$ are the coefficients describing the behavior of the transistor and $a_0$ is the $g_m$ or transconductance of the device. The third order intermodulation is eliminated when $a_2=0$. This occurs when $g_3 = a_2 v_{in}^3 = 0$, for perfect cancellation $$\left[\frac{d^3 i}{d v_{in}^3} = 0\right]$$

Figure 4A:
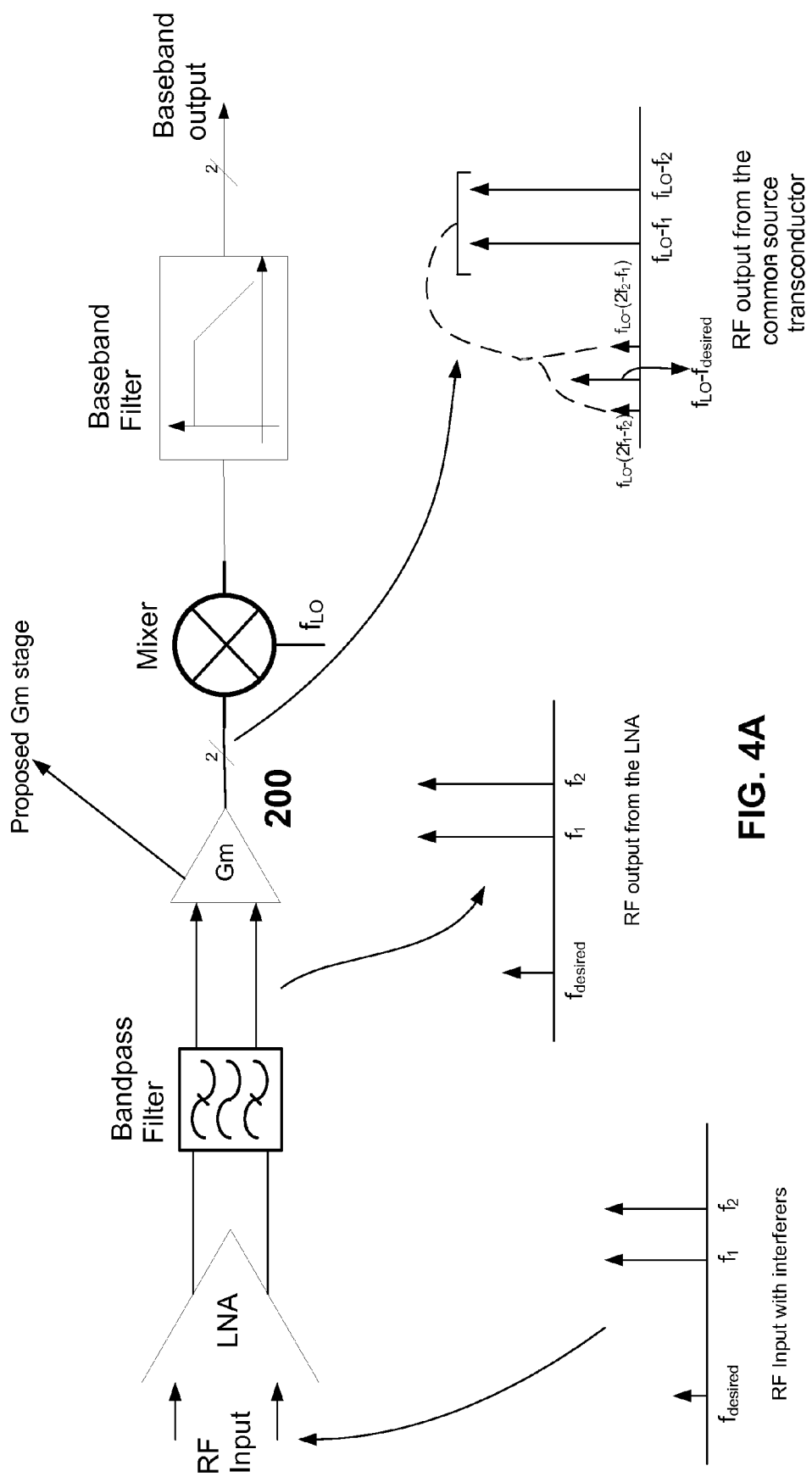
FIG. 4A illustrates that IM3 (intermodulation products) are suppressed with the transconductor apparatus and method of the present patent application.

FIG. 4A illustrates that IM3 (intermodulation products) are suppressed with the transconductor apparatus and method of the present patent application.

Figure 4B:
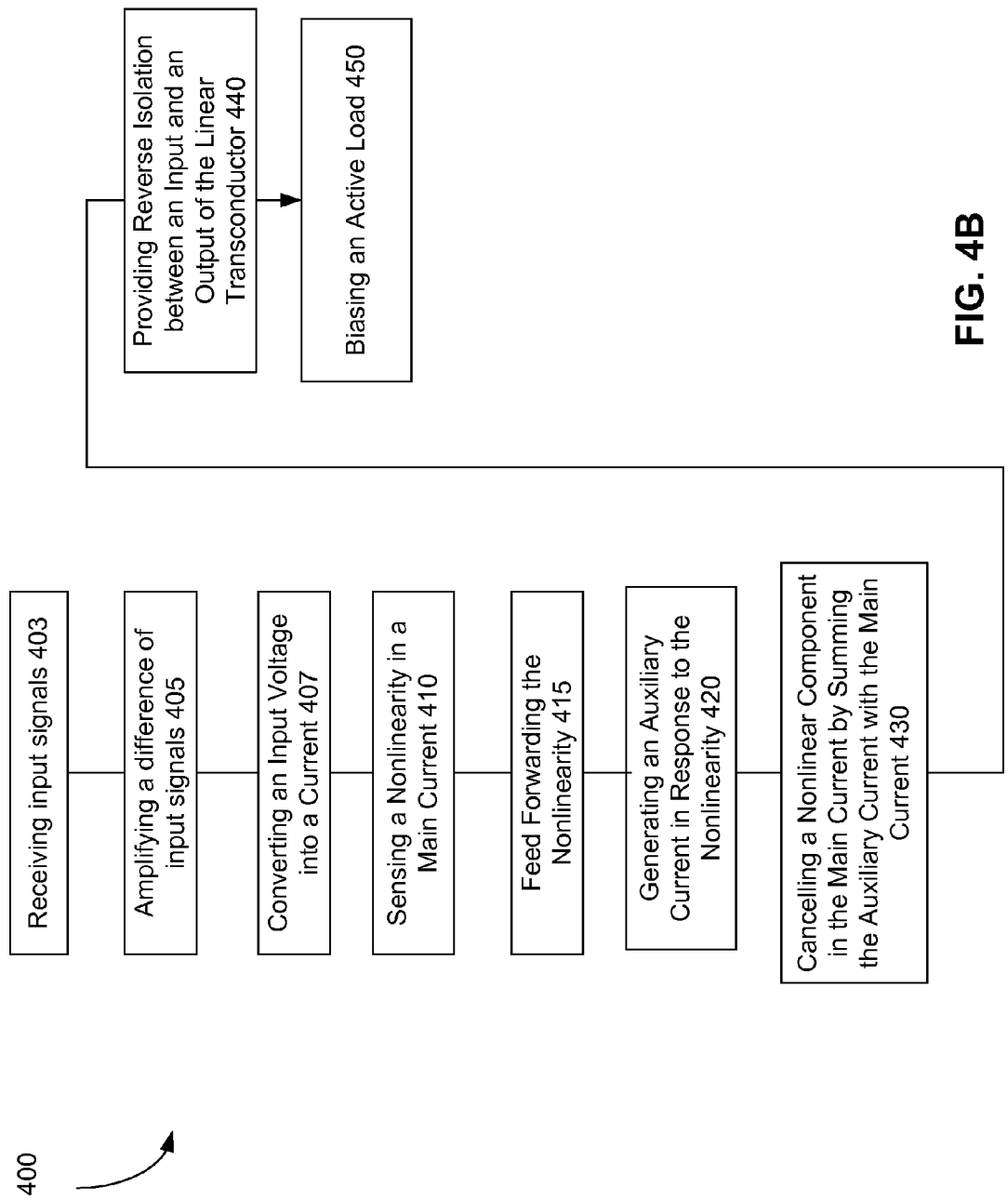
FIG. 4B is a flowchart containing steps executed by a method for reducing intermodulation products in a linear transconductor of the present patent application.

FIG. 4B contains steps executed by a method 400 for reducing intermodulation products in a linear transconductor 200 of the present patent application. The differential amplifier 210 receives signals VRF+ and VRF− respectfully (step 403), amplifies a difference of said input signals (step 405) and converts the input voltage into a current (step 407). The nonlinearity in the main current $I_{MAIN}$ is sensed by a cascode NMOS transistor circuit 225 (Step 410). More specifically, cascode NMOS transistors 230 and 235 sense the non-linearity in $I_{MAIN}$ (Step 410) due to main transistors 215 and 220. This nonlinearity is input to the feed forward (or auxiliary) transistors 245 and 250 (step 415). These auxiliary transistors generate an auxiliary current $I_{AUX}$ in response to the nonlinear input (step 420). The effective current $I_{SUM}$ is the summation of $I_{AUX}$ and $I_{MAIN}$, wherein the current $I_{AUX}$ cancels the nonlinear component in $I_{MAIN}$ (step 430) and thereby improves the intermodulation performance of the overall circuit.

Stated another way, the nonlinearity in $I_{MAIN}$ is subtracted by the feed-forward current $I_{AUX}$ when the output current from the main transistors 215 and 220, $I_{MAIN}$, is summed with the feed-forward current $I_{AUX}$ from the auxiliary devices 245 and 250, wherein the summing of the currents results in cancellation of the IM3 components from the two paths (step 430).

The cascode configuration circuit 225 (comprising NMOS transistors 230 and 235) is used to improve reverse isolation between an input and the output of the linear transconductor 200 (step 440). At the top of FIG. 3A is an active load circuit 255 containing two PMOS transistors, 267 and 260. These transistors 267 and 260 serve as active loads. The operational amplifier 275 along with resistors 265 and 270 form a common mode feedback loop to bias the PMOS devices 267, 260 (step 450). This improves the output impedance of the PMOS devices 267, 260.

Figure 5:
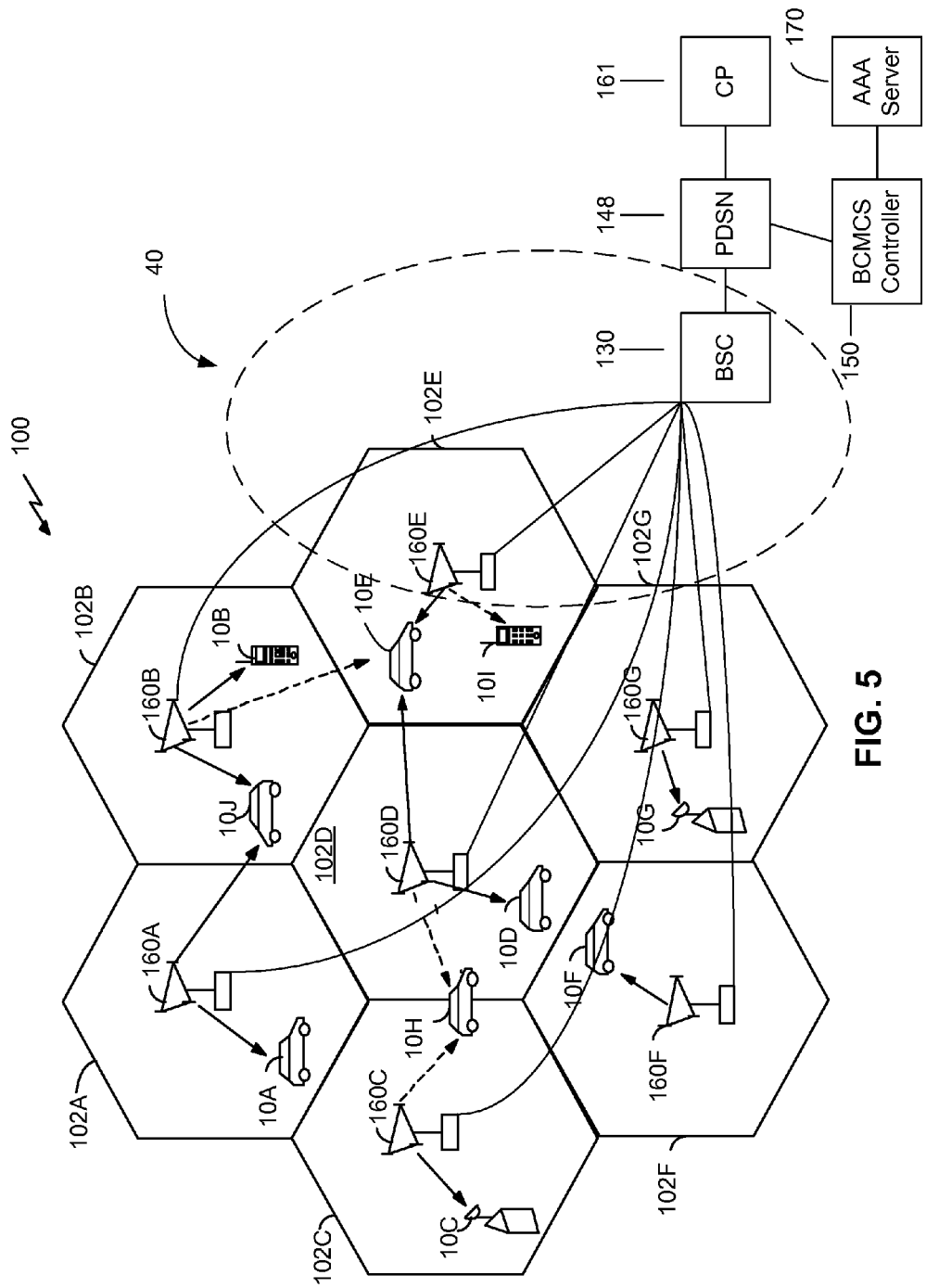
FIG. 5 is a diagram of a cellular communication system.

Communication systems may use a single carrier frequency or multiple carrier frequencies. Each link may incorporate a different number of carrier frequencies. Furthermore, an access terminal 10 may be any data device that communicates through a wireless channel or through a wired channel, for example using fiber optic or coaxial cables. An access terminal 10 may be any of a number of types of devices including but not limited to PC card, compact flash, external or internal modem, or wireless or wireline phone. The access terminal 10 is also known as user equipment (UE), a remote station, a mobile station or a subscriber station. Also, the UE 10 may be mobile or stationary. An example of a cellular communication system 100 is shown in FIG. 5 where reference numerals 102A to 102G refer to cells, reference numerals 160A to 160G refer to Node Bs or base stations and reference numerals 10A to 10G refer to UEs.

An access network 40 transports data packets between multiple access terminals 10 or user equipment 10. (In one example, an access network 40 may be comprised of a base station controller and one or more base stations 160. See FIG. 5). The access network 40 may be further connected to additional networks outside the access network 40, such as a corporate intranet or the Internet, and may transport data packets between each user equipment 10 and such outside networks 122. User equipment 10 that has established an active traffic channel connection with one or more eNode Bs 160 is called active user equipment 10, and is said to be in a traffic state. User equipment 10 that is in the process of establishing an active traffic channel connection with one or more eNode Bs 160 is said to be in a connection setup state. User equipment 10 may be any data device that communicates through a wireless channel or through a wired channel, for example using fiber optic or coaxial cables. The communication link through which the user equipment 10 sends signals to the eNode B 160 is called a reverse link. The communication link through which a NodeB 160 sends signals to a user equipment 10 is called a forward link.

Figure 7:
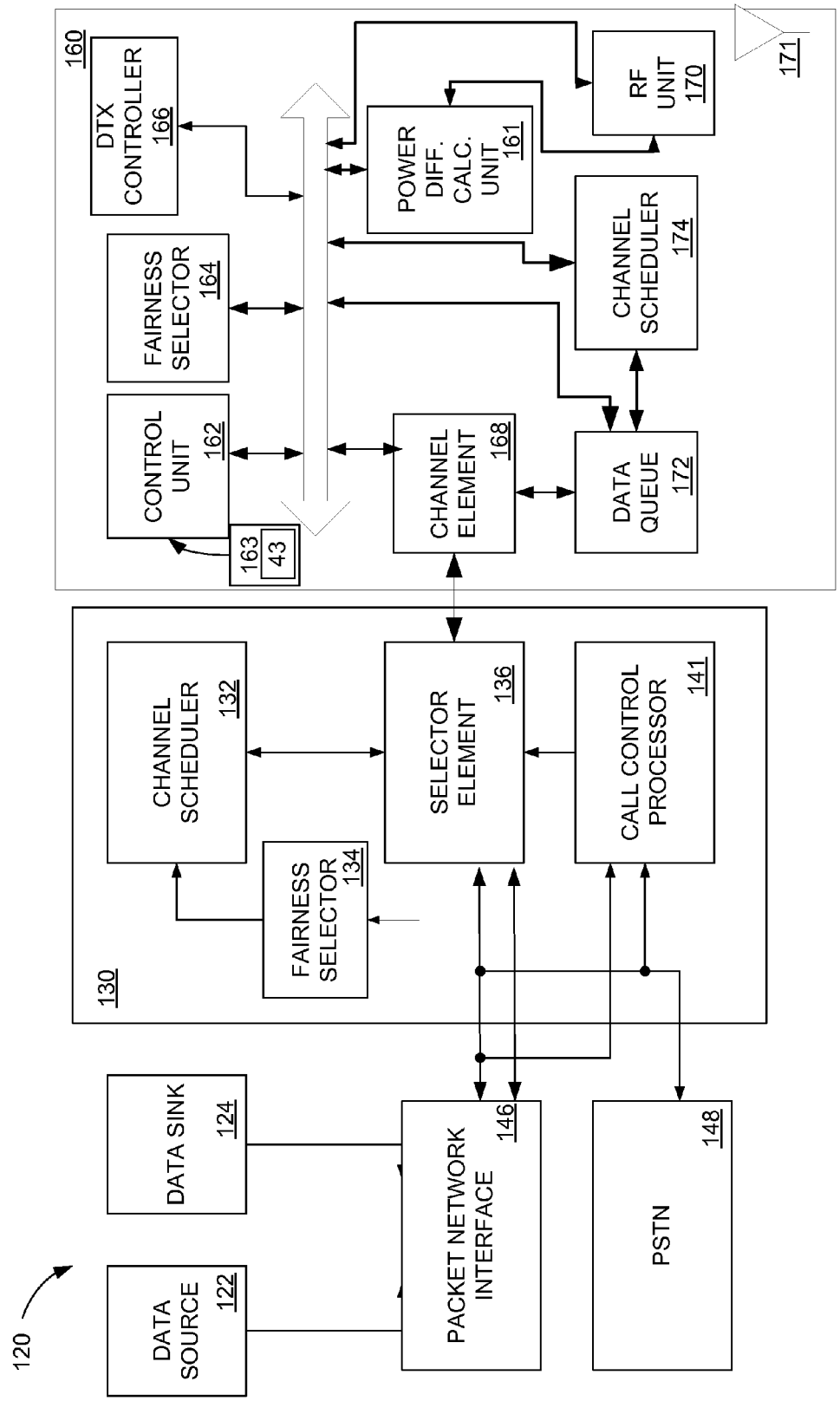
FIG. 7 is a portion of a communication system, including a base station controller and a base station.

FIG. 7 is detailed herein below, wherein specifically, an eNode B 160 and radio network controller 65 interface with a packet network interface 146. Radio network controller 65 includes a channel scheduler 132 for implementing a scheduling algorithm for transmissions in system 100. The channel scheduler 132 determines the length of a service interval during which data is to be transmitted to any particular remote station 10 based upon the remote station's 10 associated instantaneous rate for receiving data (as indicated in the most recently received DRC signal). The service interval may not be contiguous in time but may occur once every n slots. According to one embodiment, the first portion of a packet is transmitted during a first slot at a first time and the second portion is transmitted 4 slots later at a subsequent time. Also, any subsequent portions of the packet are transmitted in multiple slots having a similar 4 slots spread, i.e., 4 slots apart from each other. According to an embodiment, the instantaneous rate of receiving data $R_i$ determines the service interval length $L_i$ associated with a particular data queue.

In addition, the channel scheduler 132 selects the particular data queue for transmission. The associated quantity of data to be transmitted is then retrieved from a data queue 172 and provided to the channel element 168 for transmission to the remote station 10 associated with the data queue 172. As discussed below, the channel scheduler 132 selects the queue for providing the data, which is transmitted in a following service interval using information including the weight associated with each of the queues. The weight associated with the transmitted queue is then updated.

Radio network controller 65 interfaces with packet network interface 146, Public Switched Telephone Network (PSTN) 148, and all eNode Bs 160 in the communication system 100 (only one eNode B 160 is shown in FIG. 7 for simplicity). Radio network controller 65 coordinates the communication between remote stations 10 in the communication system and other users connected to packet network interface 146 and PSTN 148. PSTN 148 interfaces with users through a standard telephone network (not shown in FIG. 7).

Radio network controller 65 contains many selector elements 136, although only one is shown in FIG. 7 for simplicity. Each selector element 136 is assigned to control communication between one or more base stations 160 and one remote station 10 (not shown). If selector element 136 has not been assigned to a given user equipment 10, call control processor 141 is informed of the need to page the remote station. Call control processor 141 then directs eNode B 20 to page the remote station 10.

Data source 122 contains a quantity of data, which is to be transmitted to a given remote station 10. Data source 122 provides the data to packet network interface 146. Packet network interface 146 receives the data and routes the data to the selector element 136. Selector element 136 then transmits the data to eNode B 160 in communication with the target remote station 10. In the exemplary embodiment, each eNode B 160 maintains a data queue 172, which stores the data to be transmitted to the remote station 10.

The data is transmitted in data packets from data queue 172 to channel element 168. In one example, on the forward link, a "data packet" refers to a quantity of data which is a maximum of 1024 bits and a quantity of data to be transmitted to a destination remote station within a predetermined "time slot" (such as $\approx 1.667$ msec.).

For each data packet, channel element 168 inserts the necessary control fields. In the exemplary embodiment, channel element 168 performs a cyclic redundancy check, CRC, encoding of the data packet and control fields and inserts a set of code tail bits. The data packet, control fields, CRC parity bits, and code tail bits comprise a formatted packet. In the exemplary embodiment, channel element 168 then encodes the formatted packet and interleaves (or reorders) the symbols within the encoded packet. In the exemplary embodiment, the interleaved packet is covered with a Walsh code, and spread with the short pseudo-noise I (PNI) and pseudo-noise Q (PNQ) codes. The spread data is provided to RF unit 170 which quadrature modulates, filters, and amplifies the signal. The forward link signal is transmitted over the air through an antenna 171 to the forward link. The RF unit 170 may also contain, in one or more examples, the transconductor 200 of the present patent application.

At the user equipment 10, the forward link signal is received by an antenna and routed to a receiver. The receiver filters, amplifies, quadrature demodulates, and quantizes the signal. The digitized signal is provided to a demodulator (DEMOD) where it is despread with the short PNI and PNQ codes and decovered with the Walsh cover. The demodulated data is provided to a decoder which performs the inverse of the signal processing functions done at eNode B 160, specifically the de-interleaving, decoding, and CRC check functions. The decoded data is provided to a data sink.

The data rate control (DRC) signal transmitted by each remote station 10 travels through a reverse link channel and is received at the base station 160 through a transmit or receive antenna 171 coupled to RF unit 170. In one example, the DRC information is demodulated in channel element 168 and provided to a channel scheduler 132 located in the radio network controller 65 or to a channel scheduler 174 located in the eNode B 160. In a first exemplary embodiment, the channel scheduler 132 is located in the eNode B 20. In an alternate embodiment, the channel scheduler 132 is located in the radio network controller 65, and connects to all selector elements 136 within the radio network controller 65.

Figure 6:
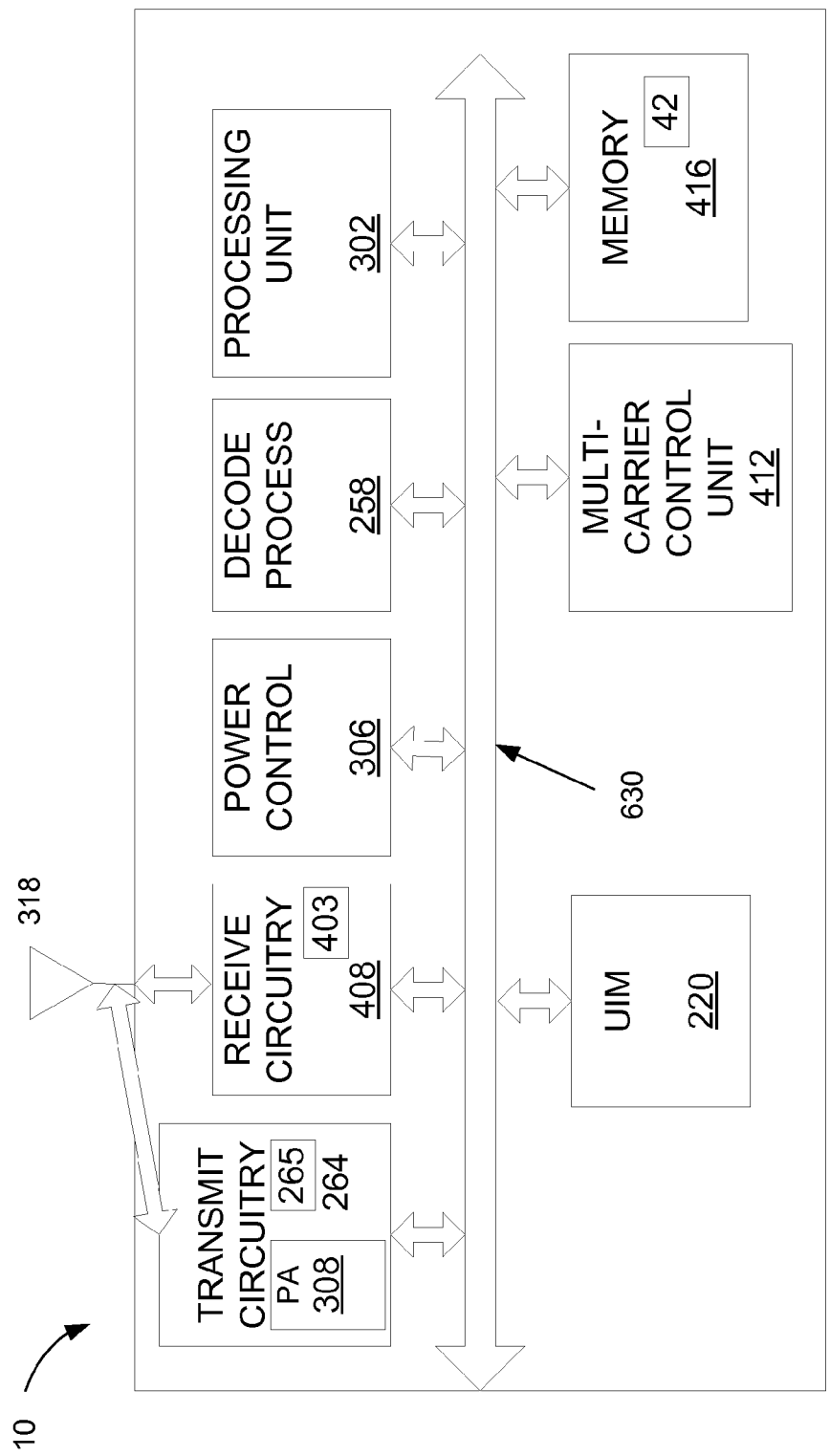
FIG. 6 illustrates an embodiment of user equipment according to the present patent application.

FIG. 6 illustrates an embodiment of a UE 10 according to the present patent application in which the UE 10 includes transmit circuitry 264 (including PA 308), receive circuitry 408, throttle control 306, decode process unit 258, processing unit 302, multi-carrier control unit 412 and memory 416. The transmit circuitry 264, receive circuitry 408 may also contain RF units 265 and 403 respectively where, in one or more examples, the transconductor 200 of the present patent application may reside.

The processing unit 302 controls operation of the UE 10. The processing unit 302 may also be referred to as a CPU. Memory 416, which may include both read-only memory (ROM) and random access memory (RAM), provides instructions and data to the processing unit 302. A portion of the memory 416 may also include non-volatile random access memory (NVRAM).

The UE 10, which may be embodied in a wireless communication device such as a cellular telephone, may also include a housing that contains a transmit circuitry 264 and a receive circuitry 408 to allow transmission and reception of data, such as audio communications, between the UE 10 and a remote location. The transmit circuitry 264 and receive circuitry 408 may be coupled to an antenna 318.

The various components of the UE 10 are coupled together by a bus system 630 which may include a power bus, a control signal bus, and a status signal bus in addition to a data bus. However, for the sake of clarity, the various busses are illustrated in FIG. 6 as the bus system 630. The AT 10 may also include a processing unit 302 for use in processing signals. Also shown are a power controller 306, a decode processor 258, power amplifier 308 and a multi-carrier control unit 412.

The steps illustrated above may be stored as instructions in the form of software or firmware 42 located in memory 416 in the user equipment 10 shown in FIG. 6. These instructions may be executed by the processing unit circuit 302 of the user equipment 10 shown in FIG. 6. The steps illustrated above may also be stored as instructions in the form of software or firmware 43 located in memory 163 in the eNode B 160. These instructions may be executed by the control unit 162 of the eNode B 160 in FIG. 7.

Figure 8:
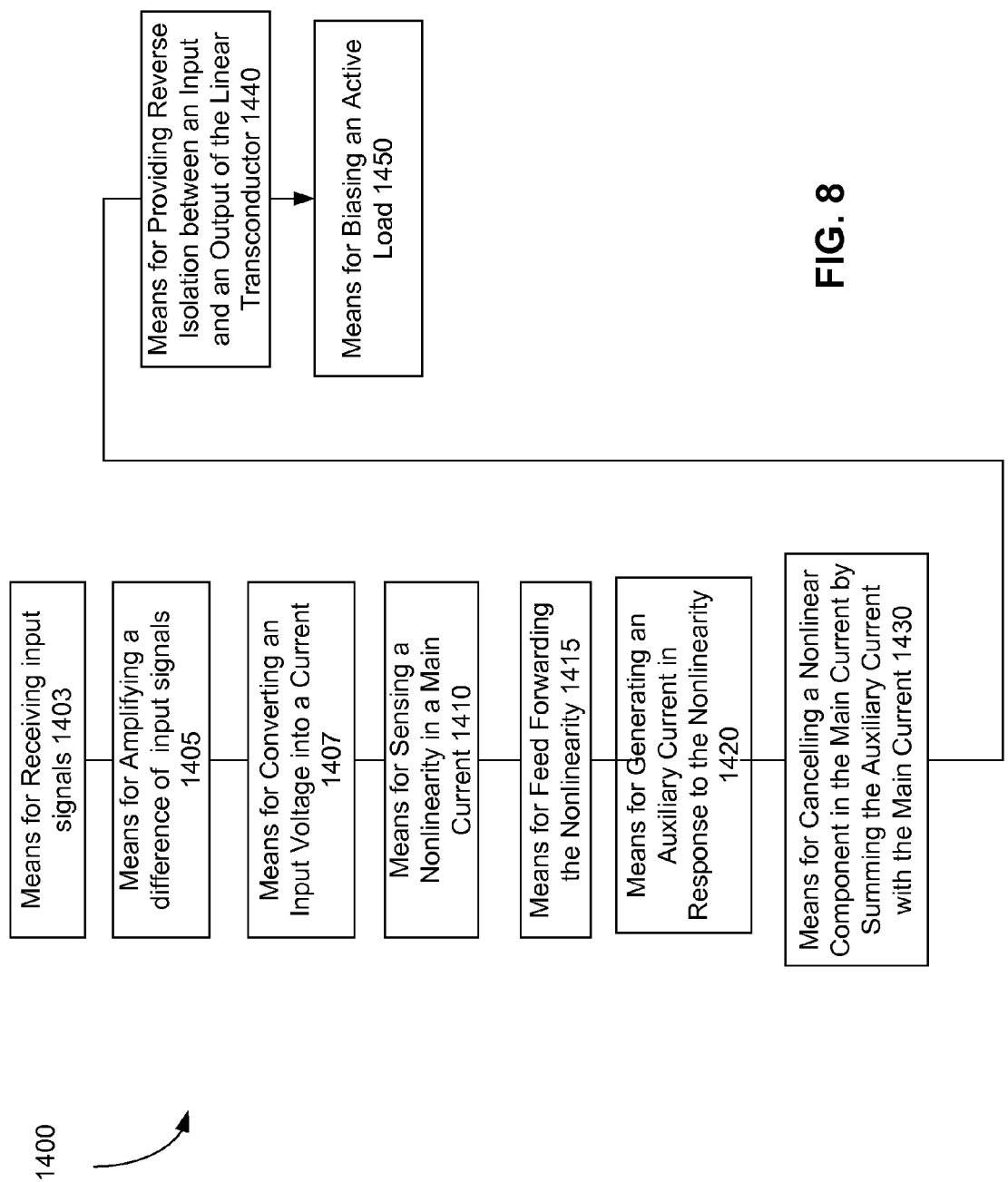
FIG. 8 is a functional block diagram illustrating the steps that are executed when reducing intermodulation products in a linear transconductor of the present patent application.

FIG. 8 is a functional block diagram illustrating the steps that are executed when reducing intermodulation products in a linear transconductor of the present patent application. The methods and apparatuses of FIG. 4B described above are performed by corresponding means plus function blocks illustrated in FIG. 8. In other words, steps 403 to 450 in FIG. 4B correspond to steps 1403 to 1450 in FIG. 8.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

Therefore, the present invention is not to be limited except in accordance with the following claims.

What is claimed is:

1. A transconductor having at least one input and at least one output, comprising:
a differential amplifier having a plurality of transistors and a plurality of inputs, wherein each of the plurality of transistors of the differential amplifier comprise a gate, source, and drain, and a difference of input signals is amplified;

a cascode circuit comprising a plurality of transistors connected in a common gate configuration, wherein said plurality of transistors of said cascode circuit each comprise a gate, source and drain, and wherein the source of each of the plurality of transistors of said cascode circuit are coupled to a corresponding drain of one of said plurality of transistors of said differential amplifier;

an active load having a plurality of transistors operably connected between said cascode configuration circuit and supply voltage; and an auxiliary device operably connected to said differential amplifier and said cascode circuit.

2. The transconductor according to claim 1, wherein said differential amplifier comprises a plurality of transistors having their sources connected together.

3. The transconductor according to claim 2, wherein said plurality of transistors of said differential amplifier are biased in a strong inversion region.

4. The transconductor according to claim 2, wherein said plurality of transistors of said differential amplifier comprises two input NMOS amplifiers have their sources connected together.

5. The transconductor according to claim 1, wherein said active load comprises:
a plurality of transistors; and
a feedback loop operably connected to said plurality of transistors.

6. The transconductor according to claim 5, wherein each of said plurality of transistors of said active load comprise a gate, a drain and a source and wherein said feedback loop is a common mode feedback loop comprising:

a plurality of resistors operably connected in series between said drains of said plurality of transistors of said active load; and an operational amplifier having an output and a plurality of inputs wherein said output is operably connected to said gates of said plurality of transistors of said active load; and at least one of said inputs is operably connected between two of said plurality of resistors.

7. The transconductor according to claim 1, wherein said plurality of transistors of said cascode circuit are operably connected to said plurality of transistors of said differential amplifier by stacking at least one transistor of said plurality of transistors of said cascode circuit on at least one transistor of said plurality of transistors of said differential amplifier.

8. The transconductor according to claim 1, wherein said plurality of transistors of said cascode circuit are operably connected to said plurality of transistors of said differential amplifier by mounting at least one transistor of said plurality of transistors of said cascode circuit as a common-gate transistor stacked on at least one transistor of said plurality of transistors of said differential amplifier, wherein reverse isolation between an input and an output of said transconductor is improved by decoupling said input and said output of said transconductor.

9. The transconductor according to claim 1, wherein said plurality of transistors of said cascode circuit are operably connected to said plurality of transistors of said differential amplifier by stacking at least one transistor of said plurality of transistors of said cascode circuit on at least one transistor of said plurality of transistors of said differential amplifier, whereby said cascode circuit senses a nonlinearity in a main current due to said transistors of said differential amplifier and feed forwards said nonlinearity to said auxiliary device.

10. The transconductor according to claim 1, wherein said plurality of transistors of said cascode circuit are operably connected to said plurality of transistors of said differential amplifier by mounting at least one transistor of said plurality of transistors of said cascode circuit as a common-gate transistor stacked on at least one transistor of said plurality of transistors of said differential amplifier, wherein reverse isolation between an input and an output of said linear transconductor is improved by buffering current between said input and said output of said linear transconductor.

11. A transconductor having at least one input and at least one output, comprising:

a differential amplifier having a plurality of transistors and a plurality of inputs, wherein a difference of input signals is amplified;

a cascode circuit having a plurality of transistors, wherein said plurality of transistors of said cascode circuit are operably connected to said plurality of transistors of said differential amplifier;

an active load having a plurality of transistors operably connected between said cascode circuit and supply voltage; and an auxiliary device, operably connected to said differential amplifier and said cascode circuit, wherein said auxiliary device has a plurality of transistors, wherein at least two of said plurality of transistors of said auxiliary device having gates operably connected between said differential amplifier and said cascode circuit, and wherein said two of said plurality of transistors of said auxiliary device are operably connected between said active load and ground.

12. The transconductor according to claim 11, wherein said auxiliary device comprises a pair of transistors biased in a weak inversion region to cancel said nonlinearity, wherein said auxiliary device generates an auxiliary current in response to the nonlinearity; and cancels a nonlinear component in the main current by summing said auxiliary current with said main current, whereby said intermodulation products are reduced.

13. The transconductor according to claim 11, wherein said differential amplifier comprises a plurality of transistors biased in a strong inversion region having their sources connected together;

wherein said cascode circuit comprises a plurality of transistors connected in a common gate configuration and wherein said plurality of transistors of said cascode circuit are operably connected to said plurality of transistors of said differential amplifier by stacking at least one transistor of said plurality of transistors of said cascode circuit on at least one transistor of said plurality of transistors of said differential amplifier, wherein said active load comprises a plurality of transistors and a feedback loop operably connected to said plurality of transistors, wherein each of said plurality of transistors of said active load comprise a gate, a drain and a source and wherein said feedback loop is a common mode feedback loop comprising a plurality of resistors operably connected in series between said drains of said plurality of transistors and an operational amplifier having an output and a plurality of inputs wherein said output is operably connected to said gates of said plurality of transistors; and at least one of said inputs is operably connected between two of said plurality of resistors; and wherein said auxiliary device comprises a pair of transistors biased in a weak inversion region to cancel said nonlinearity.

14. An access terminal, comprising:
a power controller;
transmit circuitry operably connected to said power controller;
a processing unit operably connected to said transmit circuitry;
memory operably connected to said processing unit; and
receive circuitry operably connected to said processing unit, wherein said receive circuitry comprises an RF unit comprising:
　a transconductor having at least one input and at least one output, comprising:
　　a differential amplifier having a plurality of transistors and a plurality of inputs, wherein a difference of input signals is amplified;
　　a cascode circuit having a plurality of transistors, wherein said plurality of transistors of said cascode circuit are operably connected to said plurality of transistors of said differential amplifier; and
　　an active load having a plurality of transistors operably connected between said cascode circuit and supply voltage.

15. The access terminal having at least one input and at least one output, according to claim 14, further comprising:
an auxiliary device, operably connected to said differential amplifier and said cascode circuit.

16. The access terminal according to claim 15, wherein said differential amplifier comprises a plurality of transistors with their sources connected together.

17. The access terminal according to claim 16, wherein said plurality of transistors of said differential amplifier are biased in a strong inversion region.

18. The access terminal according to claim 16, wherein said plurality of transistors of said differential amplifier comprises two input NMOS amplifiers with their sources connected together.

19. The access terminal according to claim 15, wherein said cascode circuit comprises a plurality of transistors connected in a common gate configuration.

20. The access terminal according to claim 19, wherein said plurality of transistors of said cascode circuit are operably connected to said plurality of transistors of said differential amplifier by stacking at least one transistor of said plurality of transistors of said cascode circuit on at least one transistor of said plurality of transistors of said differential amplifier.

21. The access terminal according to claim 19, wherein said plurality of transistors of said cascode circuit are operably connected to said plurality of transistors of said differential amplifier by mounting at least one transistor of said plurality of transistors of said cascode circuit as a common-gate transistor stacked on at least one transistor of said plurality of transistors of said differential amplifier, wherein reverse isolation between an input and an output of said transconductor is improved by decoupling said input and said output of said transconductor.

22. The access terminal according to claim 19, wherein said plurality of transistors of said cascode circuit are operably connected to said plurality of transistors of said differential amplifier by stacking at least one transistor of said plurality of transistors of said cascode circuit on at least one transistor of said plurality of transistors of said differential amplifier, whereby said cascode circuit senses a nonlinearity in a main current due to said transistors of said differential amplifier and feed forwards said nonlinearity to said auxiliary device.

23. The access terminal according to claim 19, wherein said plurality of transistors of said cascode circuit are operably connected to said plurality of transistors of said differential amplifier by mounting at least one transistor of said plurality of transistors of said cascode circuit as a common-gate transistor stacked on at least one transistor of said plurality of transistors of said differential amplifier, wherein reverse isolation between an input and an output of said linear transconductor is improved by buffering current between said input and said output of said linear transconductor.

24. The access terminal according to claim 15, wherein said active load comprises:
a plurality of transistors; and
a feedback loop operably connected to said plurality of transistors.

25. The access terminal according to claim 24, wherein each of said plurality of transistors of said active load comprise a gate, a drain and a source and wherein said feedback loop is a common mode feedback loop comprising:
a plurality of resistors operably connected in series between said drains of said plurality of transistors; and
an operational amplifier having an output and a plurality of inputs wherein said output is operably connected to said gates of said plurality of transistors; and
at least one of said inputs is operably connected between two of said plurality of resistors.

26. The access terminal according to claim 15, wherein said auxiliary device has a plurality of transistors, wherein at least two of said plurality of transistors of said auxiliary device having gates operably connected between said differential amplifier and said cascode circuit, and wherein said two of said plurality of transistors of said auxiliary device are operably connected between said active load and ground.

27. The access terminal according to claim 26, wherein said auxiliary device comprises a pair of transistors biased in a weak inversion region to cancel said nonlinearity, wherein said auxiliary device generates an auxiliary current in response to the nonlinearity; and cancels a nonlinear component in the main current by summing said auxiliary current with said main current, whereby said intermodulation products are reduced.

28. The access terminal according to claim 26, wherein said differential amplifier comprises a plurality of transistors biased in a strong inversion region having their sources connected together;
　wherein said cascode circuit comprises a plurality of transistors connected in a common gate configuration and wherein said plurality of transistors of said cascode circuit are operably connected to said plurality of transistors of said differential amplifier by stacking at least one transistor of said plurality of transistors of said cascode circuit on at least one transistor of said plurality of transistors of said differential amplifier,
　wherein said active load comprises a plurality of transistors and a feedback loop operably connected to said plurality of transistors, wherein each of said plurality of transistors of said active load comprise a gate, a drain and a source and wherein said feedback loop is a common mode feedback loop comprising a plurality of resistors operably connected in series between said drains of said plurality of transistors and an operational amplifier having an output and a plurality of inputs wherein said output is operably connected to said gates of said plurality of transistors; and at least one of said inputs is operably connected between two of said plurality of resistors; and
　wherein said auxiliary device comprises a pair of transistors biased in a weak inversion region to cancel said nonlinearity.

* * * * *